US006778566B2

(12) United States Patent
Miller

(10) Patent No.: US 6,778,566 B2
(45) Date of Patent: Aug. 17, 2004

(54) SYSTEM AND METHOD FOR TESTING A LASER MODULE BY MEASURING ITS SIDE MODE SUPPRESSION RATIO

(75) Inventor: Charles W. Miller, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 10/246,038

(22) Filed: Sep. 18, 2002

(65) Prior Publication Data

US 2004/0052277 A1 Mar. 18, 2004

(51) Int. Cl.[7] .......... H01S 3/00

(52) U.S. Cl. .......... 372/29.014; 372/38; 372/26; 372/6

(58) Field of Search .......... 372/29.014, 9, 372/24.02

(56) References Cited

U.S. PATENT DOCUMENTS

| | | | | | |
|---|---|---|---|---|---|
| 5,712,715 | A | * | 1/1998 | Edrdogan et al. | 359/8 |
| 5,812,572 | A | * | 9/1998 | King et al. | 372/38.04 |
| 6,504,856 | B1 | * | 1/2003 | Broberg et al. | 372/38.07 |
| 6,512,582 | B1 | * | 1/2003 | Mori et al. | 356/308 |
| 6,560,255 | B1 | * | 5/2003 | O'Brien et al. | 372/34 |
| 2003/0118062 | A1 | * | 6/2003 | Wesstrom | 372/32 |

* cited by examiner

*Primary Examiner*—Paul Ip
*Assistant Examiner*—Dung T Nguyen
(74) *Attorney, Agent, or Firm*—Workman Nydegger

(57) ABSTRACT

A key requirement of a fiber optic communication system is its ability to transmit data from one location to another relatively free of errors in the data stream. The data stream error rate is a function of the error rate of the laser module utilized to transmit the data. A fast and efficient method of testing a laser module, in order to estimate its bit error rate, is to measure side mode suppression ratios of the laser module output while operating the laser module at each of a first and second bias setting, and to generate a test result for the laser module in accordance with the difference between the first and second side mode suppression ratio measurements. Furthermore, a system is provided for performing this laser module testing method.

30 Claims, 5 Drawing Sheets

500

SYSTEM AND METHOD FOR TESTING A LASER MODULE BY MEASURING ITS SIDE MODE SUPPRESSION RATIO

FIELD OF THE INVENTION

The present invention generally relates to a system and method for testing a laser module by measuring its side mode suppression ratio.

BACKGROUND OF THE INVENTION

A key requirement of a fiber optic communication system is its ability to transmit data from one location to another relatively free of errors in the data stream. The data stream error rate is a function of the error rate of the laser module utilized to transmit the data. For fiber optic communication systems where the goal is to transmit data over long distances at high bit rates, the typical acceptable error rate is on the order of one error in one trillion bits (or $1\times10^{-12}$). In the future, even lower error rates may be required.

The prior art has provided a method for measuring the actual error rate of a laser module by utilizing a bit error rate tester to compare data transmitted through the laser module with its output over a length of time. This method is time-consuming and requires dedication of expensive capital equipment for a long period of time for each laser module tested. In addition, the method must be repeated at several different temperatures in order to simulate actual use conditions. The testing process causes wear and tear to the laser module, which has a finite useful life.

Accordingly, there remains a need in the art for a rapid, efficient and easily-automated method for testing a laser module in order to determine whether its bit error rate falls within acceptable limits for the intended application of the laser module, and a system capable of performing this method.

SUMMARY OF THE INVENTION

The present invention addresses, inter alia, the foregoing needs by providing a relatively fast and efficient method of testing a laser module by measuring a first side mode suppression ratio of the laser module output while operating the laser module at a first bias setting, measuring a second side mode suppression ratio of the laser module output while operating the laser module at a second bias setting, and generating a test result for the laser module in accordance with the difference between the first and second side mode suppression ratio measurements. The present invention further provides a system for performing the method of the invention.

DETAILED DESCRIPTION OF THE PREFERRED EMBODIMENTS

Figure 1:
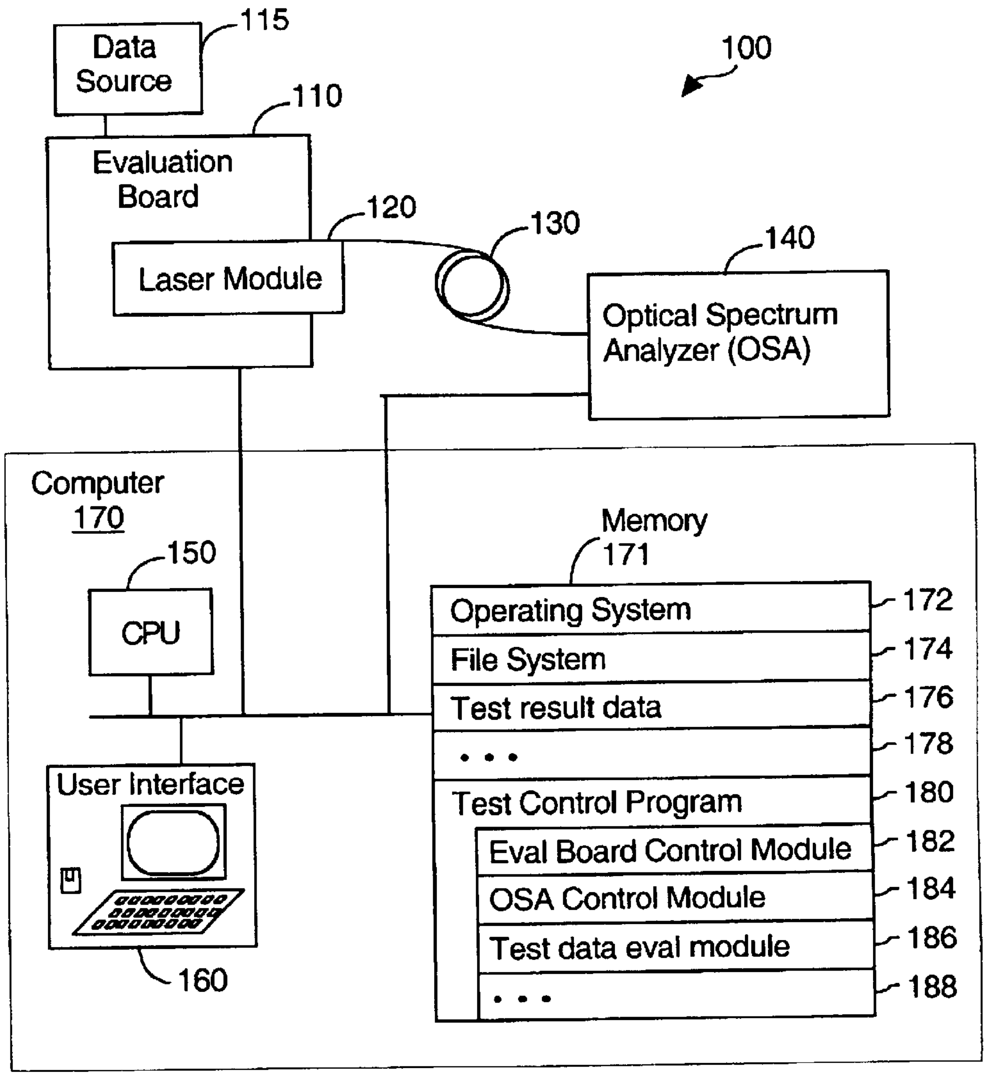
FIG. 1 is a schematic diagram of a preferred embodiment of the apparatus according to the present invention.

The structure and function of the preferred embodiments can best be understood by reference to the drawings. Where the same reference numerals appear in multiple figures, the numerals refer to the same or corresponding structure in those figures.

As shown in FIG. 1, in a laser module testing system 100, a laser module 120 is capable of being mounted to and operated by evaluation board 110. Laser module 120 may include a distributed feedback (DFB) laser with a threshold current level. Evaluation board 110 supplies power to laser module 120, including AC and DC current. Data source 115 supplies a modulated electrical data stream signal to evaluation board 110. Data source 115 can be, for example, a commercially available bit error rate transmitter (BERT) or a low cost circuit (typically mounted on a printed circuit board) specifically designed for such purpose. Data source 115 should be capable of delivering data stream signals that are similar to the data streams that will be encountered by laser module 120 in actual field use. Evaluation board 110 transmits the electrical data stream signal from data source 115 to laser module 120. Laser module 120 converts the electrical signal into an optical signal output. Output from the laser module is directed to a testing device 140 capable of measuring optical output of the laser module with respect to wavelength. In the preferred embodiment, testing device 140 is an optical spectrum analyzer (OSA). Output from laser module 120 is directed to testing device 140 through a length of optical fiber 130. Evaluation board 110 and testing device 140 are coupled to CPU 150, user interface 160, and memory 171. Memory 171 may include high speed random access memory and non-volatile memory such as disk storage. Memory 171 stores, inter alia, operating system 172, file system 174, test result data 176, test control program 180, evaluation board control module 182, OSA control module 184 and test data evaluation module 188. More generally, memory 171 stores control software for execution by the CPU 150 of computer 170, where the control software is capable of evaluating the laser module 120 by controlling function of the laser module 120, testing device 140 and evaluation board 110 in order to perform all steps of the method of the present invention.

Figure 2:
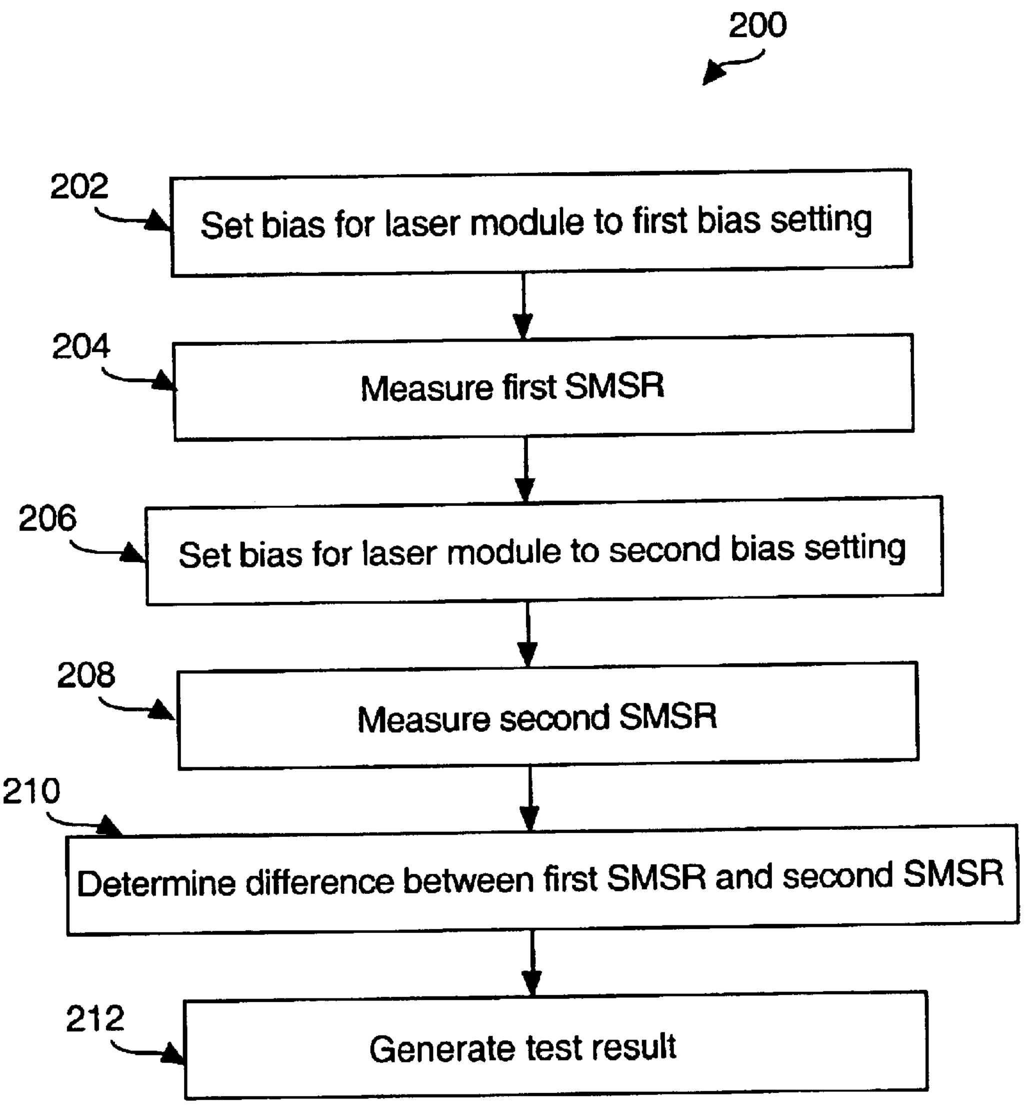
FIG. 2 is a flow chart depicting a method of the present invention.

FIG. 2 shows a method 200 of the present invention. During step 202, laser module 120 is set at a first bias setting, including associated AC and DC current level settings. Further, data is provided to and transmitted by the laser module during at least the measurement steps 204, 208 of the method. Preferably, the data transmission rate of the laser module during the testing is similar to the data rate to be used during normal operation of the laser diode, e.g., a data rate in the range of 1 Gb/s to 10 Gb/s.

During step 204, a first side mode suppression ratio is measured from output from laser module 120 while the laser module is operated at the first bias setting. During step 206, laser module 120 is set at a second bias setting, including associated AC and DC current level settings. One may predetermine which of the first or second bias settings will comprise a lower DC current level voltage than the other bias setting. In the preferred embodiment, the first bias setting includes the DC and AC currents suitable for field operation of laser module 120, and the second bias setting includes a DC current level that is approximately 5 mA lower than the first bias setting. More generally, the difference between the DC current of the first and second settings is less than 15 mA, and preferably is 5 mA or less. During step 208, a second side mode suppression ratio is measured from output from laser module 120 while the laser module is operated at the second bias setting. During step 210, a difference between the first and second side mode suppression ratio measurements is determined, and then in step 212 a test result is generated for laser module 120 in accordance with that difference. In accordance with the test result, one may evaluate the suitability of laser module 120 for such uses as long haul data communication through optical fiber.

In a preferred embodiment, the first and second side mode suppression ratios are computed using logarithmic (e.g., decibel) units, for example:

$$SMSR=10\ \mathrm{Log}_{10}(\mathrm{Peak1}/\mathrm{Peak2})$$

(where Peak1 and Peak2 represent the highest and second highest optical power peaks as a function of wavelength). As a result, the difference between the first and second side mode suppression ratios, ΔSMSR, represents a percentage change in the side mode suppression ratio between the first and second bias settings, as opposed to an absolute change in the side mode suppression ratio. In other embodiments, absolute measurement units, or other suitable units may be used to represent the first and second side mode suppression ratios and the difference therebetween.

In the preferred embodiment, evaluation board 110 supplies both a data stream received from data source 115 and AC and DC current to laser module 120 in accordance with instructions from control software executed by computer 170. Further, in the preferred embodiment, testing device 140 measures the side mode suppression ratios at each of the first and second bias settings and generates the test result in accordance with the difference between the first and second side mode suppression ratio measurements.

In alternate embodiments of the present invention, the division of tasks performed during method 200 may be different from that described above. For example, some of the tasks performed by the testing device 140 in the preferred embodiment may be performed by the computer 170 of the evaluation board 110, and some or all of the tasks performed by the computer 170 in the preferred embodiment may be performed by a processor on the evaluation board 110 or by another device. In one particular alternate embodiment of the present invention, computer 170 is coupled to evaluation board 110 and device 140, and utilizes control software to determine the first and second side mode suppression ratios and to evaluate the laser module. It does this by sending first control signals to evaluation board 110 to operate laser module 120 at a first bias setting, receiving first information from testing device 140 associated with operation of laser module 120 at the first bias setting and using the first information to determine a first side mode suppression ratio of the laser module output while operating the laser module at the first bias setting. The computer 170 continues evaluating the laser module by sending second control signals to evaluation board 110 to operate laser module 120 at a second bias setting, receiving second information from testing device 140 associated with operation of the laser module at the second bias setting and using the second information to determine a second side mode suppression ratio of the laser module output while operating the laser module at the second bias setting.

In the alternate embodiment being described, the computer 170 generates a test result for laser module 120 in accordance with a difference between the first and second side mode suppression ratio measurements. In this alternate embodiment, the testing device 140 generates the first information and second information in the form of optical power output measurements at multiple wavelengths. The computer 170 uses these measurements to determine highest and second highest peaks of the output optical power as a function of wavelength. From the highest and second highest peaks in the first information the computer computes the first side mode suppression ratio, and from the highest and second highest peaks in the second information the computer computes the second side mode suppression ratio.

Figure 3:
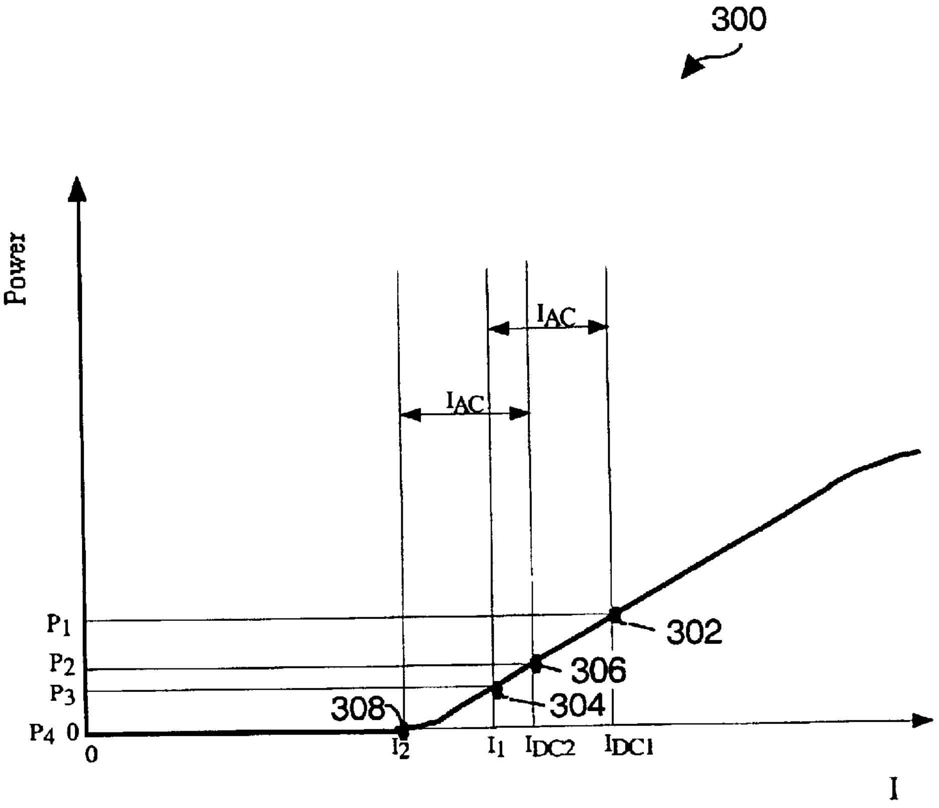
FIG. 3 is a graph of the relationship between power and current supplied to a laser module.

Referring to FIG. 3, graph 300 shows a relationship between power and current supplied to laser module 120 during steps 202, 204, 206 and 208, which can be used to depict the key features of the levels of AC and DC current supplied to laser module 120 in conjunction with first and second bias settings. Levels of AC and DC current supplied to laser module 120 at a first bias setting can be determined by increasing a DC current supplied to laser module 120 until a desired optical power output is achieved (as represented by DC operating point 302), and then varying an AC current supplied to the laser module until a desired extinction ratio is achieved. At the first bias setting, the laser module has an operating range represented by operating points 302 and 304 in FIG. 3. A second bias setting can be determined by increasing or decreasing a DC current supplied to laser module 120 (306) while maintaining an AC current to the laser module that is substantially equal to the AC current level of the first bias setting. At the second bias setting, the laser module has an operating range represented by operating points 306 and 308. The first or second bias setting having the lower DC current level causes laser module 120 to operate at a range of current levels that is at least partially below the laser module's threshold current level. This "below threshold" mode of operation is represented by point 308 in FIG. 3.

Figure 4:
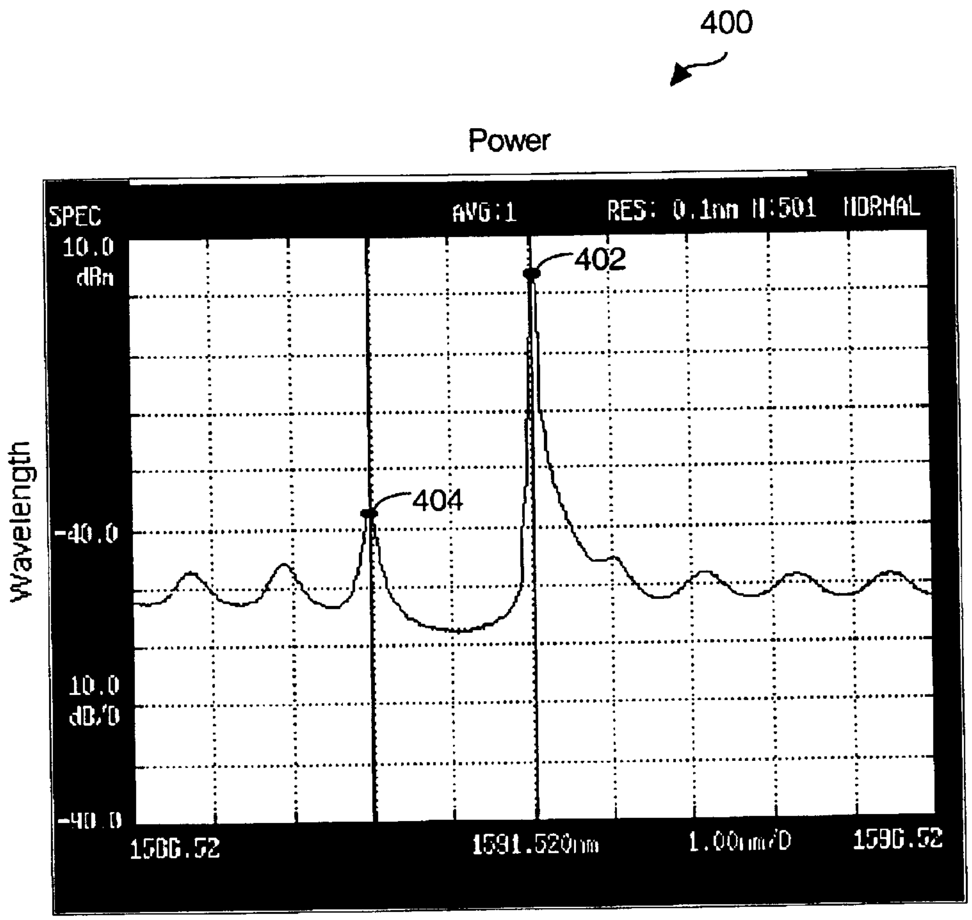
FIG. 4 is a graph of the relationship between power and wavelength for an exemplary typical laser module.

Referring to FIG. 4, graph 400 shows a relationship between wavelength and optical output power for laser module 120 while the laser module is operated at either a first or second bias setting. Wavelength peaks generated by plotting wavelength vs. power are used to measure a side mode suppression ratio of laser module 120 at each of the first and second bias settings. In the preferred embodiment, the data contained in graph 400 is generated by testing device 140 based on output from laser module 120 received through optical fiber 130. A side mode suppression ratio measurement for the laser module operating at a given bias setting is measured by computing the ratio of the power values at the highest wavelength peak (402) and second highest wavelength peak (404). If the power values are measured in decibel units, as is the case in the preferred embodiment, this ratio is computed by subtracting the second highest power value from the highest power value. In the preferred embodiment, testing device 140 performs this calculation. In alternate embodiments, a side mode suppression ratio can be calculated by computer 170 or manually by a user, using power vs. wavelength data generated by testing device 140.

Figure 5:
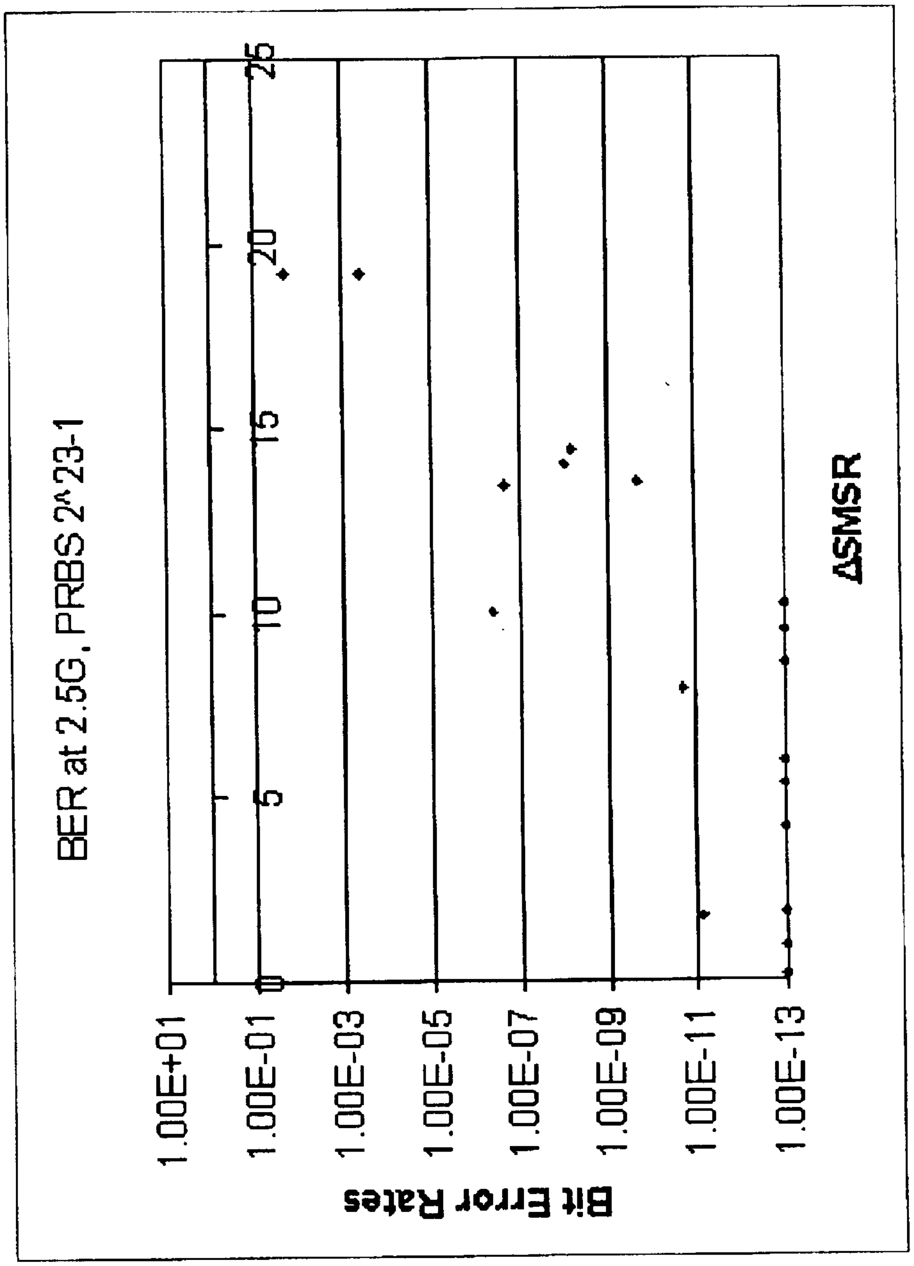
FIG. 5 is a graph of the relationship between bit error rates and ΔSMSR.

Referring to FIG. 5, graph 500 shows the relationship between actual bit error rates measured for several laser modules 120 and ΔSMSR (the difference between first and second side mode suppression ratio measurements) for those laser modules in accordance with the method of the present invention. Graph 500 demonstrates that a ΔSMSR measurement below approximately ten decibels (10 db) is indicative of an actual bit error rate on the order of $1\times10^{-13}$ for the laser module. In the preferred embodiment, a ΔSMSR measurement of less than five decibels (5 db) is considered sufficiently reliable to deem a laser module suitable for such uses as long haul data communication through optical fiber at the full data rate for which the laser module has been designed, for which the typical acceptable error rate is on the order of one error in one trillion bits (or $1\times10^{-12}$). Laser modules whose ΔSMSR is above 5 db may not, in some circumstances, be considered suitable for such uses, and are labeled for use at lower data transmission rates (e.g., 1 Gb/s instead of 2.5 Gb/s, or 2.5 Gb/s instead of 5 Gb/s) than the laser modules whose ΔSMSR is below 5 db, and/or for shorter transmission lengths than the laser modules whose ΔSMSR is below 5 db. In alternate embodiments, a ΔSMSR other than 5 db may be used as the threshold to determine the laser's suitability for a particular use.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A method of testing a laser module, comprising:

operating the laser module at a first bias setting;

measuring a first side mode suppression ratio of the laser module output based on a first ratio of highest and next highest optical power peaks as a first function of first wavelength while operating the laser module at the first bias setting;

operating the laser module at a second bias setting;

measuring a second side mode suppression ratio of the laser module output based a second ratio of highest and next highest optical power peaks as a second function of second wavelength while operating the laser module at the second bias setting; and generating a test result for the laser module in accordance with a difference between the first and second side mode suppression ratios in order to determine whether the laser module is suitable for a desired use.

2. The method according to claim 1, further comprising evaluating the suitability of the laser module for long haul data communication through optical fiber in accordance with the test result.

3. The method according to claim 1, wherein a predetermined one of the first and second bias settings comprises a lower DC current level voltage than the other bias setting.

4. The method according to claim 3, further comprising determining a level for the first bias setting by:

increasing a DC current supplied to the laser module until a desired output power is achieved; and varying an AC current supplied to the laser module until a desired extinction ratio is achieved.

5.The method according to claim 3, wherein the second bias setting further comprises an AC current level substantially equal to an AC current level of the first bias setting.

6. The method according to claim 5, wherein the laser module has a threshold current level, and the DC current level and AC current level of the predetermined one of the bias settings cause the laser module to operate at a range of current levels that is at least partially below the threshold current level.

7. The method according to claim 3, wherein the first bias setting and the second bias setting each have an associated AC current level;

the laser module has a threshold current level; and the DC current level and AC current level of the predetermined one of the bias settings cause the laser module to operate at range of current levels that is at least partially below the threshold current level.

8. The method according to claim 1, wherein a current difference associated with the first and second bias settings measures less than or equal to 10 mA.

9. The method according to claim 1, wherein the first and second side mode suppression ratios are measured by an optical spectrum analyzer.

10. The method according to claim 1, wherein the laser module comprises a distributed feedback laser.

11. The method according to claim 1, further comprising determining a level for the first bias setting by:

increasing a DC current supplied to the laser module until a desired output power is achieved; and varying an AC current supplied to the laser module until a desired extinction ratio is achieved.

12. A method for determining the suitability of a laser module for long haul data communication through optical fiber, the method comprising:

operating the laser module at a first bias setting;

measuring a first side mode suppression ratio of the laser module output based on a first ratio of highest and next highest optical power peaks as a first function of first wavelength while operating the laser module at the first bias setting;

operating the laser module at a second bias setting;

measuring a second side mode suppression ratio of the laser module output based on a second ratio of highest and next highest optical power peaks as a second function of second wavelength while operating the laser module at the second bias setting; and evaluating the suitability of the laser module for long haul data communication through optical fiber in accordance with a difference between the first and second side mode suppression ratios.

13. The method according to claim 12, wherein the second bias setting comprises a lower DC current level voltage than the first bias setting.

14. The method according to claim 12, wherein the current difference associated with the first and second bias settings measures less than or equal to 10 IDA.

15. The method according to claim 12, wherein the first and second side mode suppression ratios are measured by an optical spectrum analyzer.

16. The method according to claim 12, wherein the laser module comprises a distributed feedback laser.

17. The method according to claim 12, further comprising determining a level for the first bias setting by:

increasing a DC current supplied to the laser module until a desired output power is achieved; and varying an AC current supplied to the laser module until a desired extinction ratio is achieved.

18. A system for testing a laser module, comprising:

a testing device capable of measuring optical output of the laser module with respect to wavelength; and a computer coupled to the testing device, the computer comprising one or more modules for evaluating the laser module by:

operating the laser module at a first bias setting;

determining a first side mode suppression ratio of the laser module output based on a first ratio of highest and next highest optical power peaks as a first function of first wavelength while operating the laser module at the first bias setting;

operating the laser module at a second bias setting;

determining a second side mode suppression ratio of the laser module output based on a second ratio of highest and next highest optical power peaks as a second function of second wavelength while operating the laser module at the second bias setting; and generating a test result for the laser module in accordance with a difference between the first and second side mode suppression ratios in order to determine whether the laser module is suitable for a desired use.

19. The system according to claim 18, wherein the testing device comprises an optical spectrum analyzer.

20. The system according to claim 18, wherein the testing device comprises an optical spectrum analyzer that generates a first signal representing the first side mode suppression ratio of the laser module output while operating the laser module at the first bias setting and a second signal representing the second side mode suppression ratio of the laser module output while operating the laser module at the second bias setting.

21. The system according to claim 18, further comprising a length of optical fiber through which the optical output from the laser module is transmitted to the testing device.

22. The system according to claim 18, wherein the laser module comprises a distributed feedback laser.

23. The system according to claim 18, wherein the computer comprises one or modules for evaluating the suitability of the laser module for long haul data communication through optical fiber in accordance with the test result.

24. The system according to claim 18, wherein the second bias setting comprises a lower DC current level voltage than the first bias setting.

25. The system according to claim 18, wherein the computer comprises one or modules for determining a level for the first bias setting by:

increasing a DC current supplied to the laser module until a desired output power is achieved; and varying an AC current supplied to the laser module until a desired extinction ratio is achieved.

26. The system according to claim 18, wherein a current difference associated with the first and second bias settings measures less than or equal to 10 IDA.

27. The system according to claim 28, wherein the laser module comprises a distributed feedback laser.

28. A system for evaluating the suitability of a laser module for long haul data communication through optical fiber, comprising:

an evaluation board on which the laser module can be mounted and operated;

a testing device capable of measuring optical output of the laser module with respect to wavelength;

a computer coupled to the evaluation board and testing device, the computer comprising one or more modules for evaluating the laser module by:

sending first control signals to the evaluation board to operate the laser module at a first bias setting;

receiving first information from the testing device associated with operation of the laser module at the first bias setting, and using the first information to determine a first side mode suppression ratio of the laser module output base on a first of highest and next highest optical power peaks as a first function of first wavelength while operating the laser module at the first bias setting;

sending second control signals to the evaluation board to operate the laser module at a second bias setting;

receiving second information from the testing device associated with operation of the laser module at the second bias setting, and using the second information to determine a second side mode suppression ratio of the laser module output based on a second ratio highest and next highest optical power peaks as a second function of second wavelength while operating the laser module at the second bias setting; and generating a test result for the laser module in accordance with a difference between the first and second side mode suppression ratios.

29. A computer readable medium containing computer executable instructions for instructing a computer to test a laser module by performing the acts of:

operating the laser module at a first bias setting;

measuring a first side ode suppression ratio of the laser module output based on a first ratio of highest and next highest optical power peaks as a first function of first wavelength while operating the laser module at the first bias setting;

operating the laser module at a second bias setting;

measuring a second side mode suppression ratio of the laser module output based a second ratio of on highest and next highest optical power peaks as a second function of second wavelength while operating the laser module at the second bias setting; and generating a test result for the laser module in accordance with a difference between the first and second side mode suppression ratios in order to determine whether the laser module is suitable for a desired use.

30. A computer readable medium containing computer executable instructions for instructing a computer to test a laser module for long haul data communication through optical fiber by performing the acts of:

operating the laser module at a first bias setting;

measuring a first side mode suppression ratio of the laser module output based on a first ratio of highest and next highest optical power peaks as a first function of first wavelength while operating the laser module at the first bias setting;

operating the laser module at a second bias setting;

measuring a second side mode suppression ratio of the laser module output based on a second ratio of highest and next highest optical power peaks as a second function of second wavelength while operating the laser module at the second bias setting; and evaluating the suitability of the laser module for long haul data communication through optical fiber in accordance with a difference between the first and second side mode suppression ratios.

* * * * *

UNITED STATES PATENT AND TRADEMARK OFFICE

CERTIFICATE OF CORRECTION

PATENT NO. : 6,778,566 B2 
DATED : August 17, 2004
INVENTOR(S) : Charles W. Miller It is certified that error appears in the above-identified patent and that said Letters Patent is hereby corrected as shown below:

Column 3,
Line 39, before "device" insert -- testing --.

Column 7,
Lines 21 and 28, before "modules" insert -- more --.
Line 56, before "of highest" insert -- ratio --.

Column 8,
Line 20, after "first side" change "ode" to -- mode --.
Line 27, change "a second ratio of on highest" to -- on a second ratio of highest --.

Signed and Sealed this

Thirtieth Day of May, 2006

JON W. DUDAS
*Director of the United States Patent and Trademark Office*